United States Patent [19]
Iravani et al.

[11] Patent Number: 5,994,968
[45] Date of Patent: *Nov. 30, 1999

[54] VCO HAVING A LOW SENSITIVITY TO NOISE ON THE POWER SUPPLY

[75] Inventors: Kamran Iravani, San Jose, Calif.; Gary Miller, Corbett, Oreg.

[73] Assignee: VLSI Technology, Inc., San Jose, Calif.

[ * ] Notice: This patent is subject to a terminal disclaimer.

[21] Appl. No.: 08/972,771

[22] Filed: Nov. 18, 1997

[51] Int. Cl.$^6$ .............................. H03L 7/099; H03B 5/02
[52] U.S. Cl. .............................. 331/57; 331/34; 331/175; 327/157
[58] Field of Search .............................. 331/57, 175, 34; 327/157, 333; 326/80, 81

[56] References Cited

U.S. PATENT DOCUMENTS

| | | | |
|---|---|---|---|
| 5,515,012 | 5/1996 | Bhushan et al. | 331/17 |
| 5,563,553 | 10/1996 | Jackson | 331/57 |

*Primary Examiner*—Arnold Kinkead
*Attorney, Agent, or Firm*—Wagner, Murabito & Hao LLP

[57] ABSTRACT

The present invention comprises a voltage controlled oscillator (VCO) circuit having high power supply noise rejection. The VCO circuit includes a VCO input for receiving a control voltage. A level shifter circuit is coupled to the VCO input. A first and second VCO cell are coupled to the level shifter circuit and are coupled to each other. The VCO circuit also includes a VCO output for transmitting a VCO output signal. A first source follower transistor is coupled to the first VCO cell to transmit a first voltage from the power supply to the first VCO cell. A second source follower transistor is coupled to the second VCO cell to transmit a second voltage from the power supply to the second VCO cell. A first and second load transistor are included in each VCO cell. They are directly coupled to receive the control voltage such that the VCO output signal is less sensitive to noise on the power supply and the VCO output signal remains stable. Additionally, the level shifter is coupled to control the first source follower transistor and the second source follower transistor such that the first voltage and the second voltage are insensitive to noise on the power supply.

13 Claims, 7 Drawing Sheets

VCO HAVING A LOW SENSITIVITY TO NOISE ON THE POWER SUPPLY

TECHNICAL FIELD

The present invention relates to the field voltage controlled oscillators. More particularly, the present invention relates to a voltage controlled oscillator (VCO) having a low sensitivity to noise on its power supply.

BACKGROUND ART

Voltage controlled oscillators (VCOs) are well known and widely used in the electronics industry Within the digital communications field, VCOs are used in a variety of applications. Such applications include, for example, frequency synthesizers, signal generation, (e.g., serial transmission clock recovery) and the like. VCOs are typically designed to perform within a given set of boundary conditions and to perform to a specified standard. Typical conditions include, for example, performance over operating temperature ranges, sensitivity to vibration, output sensitivity to interference, and the like. Typical performance standards include, for example, output signal frequency stability, output signal programmability, and the like.

A typical prior art VCO generates an oscillating output signal having a specified frequency. The signal can have several different wave forms (e.g., square, saw tooth, triangular, etc.). The frequency of the output is tunable and is a function of an input voltage, an external resistance or capacitance, or the like. The type of application in which the VCO is used dictates its operating conditions and performance requirements. However, as in most VCO applications, it is usually important that the output frequency of the VCO is stable and is a consistent function of the control inputs (e.g., voltage, capacitance, and the like).

For example in a case where a prior art VCO is used in an application for clock recovery in a serial transmission system, it is important that the output frequency remain stable. The output frequency is used to reconstruct a serial transmission clock signal, which in turn, is used to sample data on a serial transmission line. Distortion or variation in the VCO output frequency, and hence, the reconstructed clock signal, could lead to sampling errors, lost data, decreased throughput, or other such problems. Consequently, for these applications it is important that the VCO provide a very stable, noise free output signal having a controlled frequency.

One of the main problems prior art VCOs need to contend with is power supply noise. Noise in the power supply can have a detrimental effect on the VCO's output stability. As a typical VCO draws current from a power supply, noise with this current (or voltage), or noise from other external devices (e.g., electromagnetic interference), can affect the output frequency. Such noise typically manifests itself as jitter on the rising and falling edges of the output signal, frequency skew in the output signal, or other distortions in the fidelity of the output. This noise typically includes low, mid-band, and high frequency components. VCOs need to be designed such that they are tolerant of power supply noise, including each of its components.

One approach to the power supply noise problem is to prefiltering. The current and voltage transmitted from the power supply is carefully filtered to remove noise. However, prefiltering is often insufficient in removing all component frequencies of noise. Some components of noise often remain. Hence, VCOs need to be designed to tolerate such noise.

Accordingly, in most VCOs, a large portion of their circuitry is devoted to power supply noise rejection in order to enhance the stability of the output. These solutions, however, are only partially effective. As applications have become more complex and as noise sensitivity has increased, VCO sensitivity to power supply noise has increased. In addition, as integration levels increase, performance standards for circuits incorporating VCOs become more exacting.

Thus, what is required is a circuit which solves the power supply noise problems associated with the prior art. The required circuit should not be adversely affected by noise in the power supply. The required circuit should exhibit higher power supply noise rejection. The present invention provides a novel solution to the above requirements.

DISCLOSURE OF THE INVENTION

The present invention provides a solution which solves the power supply noise problems associated with the prior art. The present invention is not adversely affected by noise in the power supply. In addition, the present invention exhibits higher power supply noise rejection than prior art VCOs.

In one embodiment, the present invention comprises a voltage controlled oscillator (VCO) circuit having high power supply noise rejection. The VCO circuit includes a VCO input for receiving a control voltage. A level shifter circuit is coupled to the VCO input. A first and second VCO cell are coupled to the level shifter circuit and are coupled to each other. The VCO circuit also includes a VCO output for transmitting a VCO output signal. A first source follower transistor is coupled to the first VCO cell to transmit a first voltage from the power supply to the first VCO cell. A second source follower transistor is coupled to the second VCO cell to transmit a second voltage from the power supply to the second VCO cell. The level shifter is coupled to control the first source follower transistor and the second source follower transistor such that the voltage between their respective gates and the sources maintain them in saturation. In so doing, the VCO output signal remains stable and is not significantly affected by noise on the power supply.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, a voltage controlled oscillator having a low sensitivity to noise on the power supply, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present invention provides a solution which solves the power supply noise problems associated with the prior art. The present invention is not adversely affected by noise in the power supply. In addition, the present invention exhibits higher power supply noise rejection than prior art VCOs. Hence, VCOs in accordance with the present invention are well suited for applications requiring exacting VCO performance. The present invention and its benefits are further described below.

Figure 1:
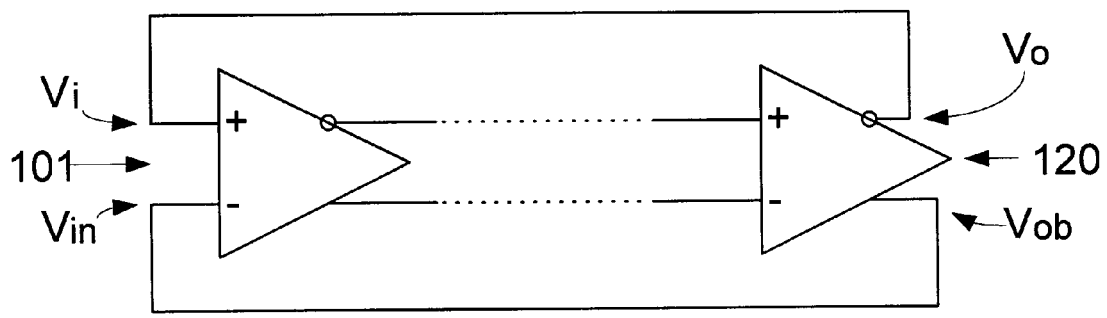
FIG. 1 shows a schematic block diagram of a VCO in accordance with one embodiment of the present invention.

FIG. 1 shows a schematic block diagram of a VCO 100 in accordance with one embodiment of the present invention. VCO 100 illustrates the general scheme of operation of the present invention. VCO 100 is comprised of a plurality of inverters coupled to form a "chain" where the output of the first inverter is coupled to the input of the second inverter, and so on throughout the chain. Each inverter has a positive and a negative input and a corresponding positive and negative output. The first inverter, e.g., inverter 101 of VCO 100 has its outputs coupled to the inputs of the next inverter, and so on, until the last inverter 120 in the chain is coupled. The plurality of inverters between inverter 101 and 120 are represented by dotted lines. The outputs of the last inverter 120 are coupled to the inputs of the first inverter 101. The resulting feed back effects an oscillation within VCO 100. The number of inverters included in VCO 100 largely determines the resulting natural frequency of oscillation and the total gain. The frequency of oscillation is variable over a range. The degree of variation is determined by the application of a control voltage to the circuitry comprising each inverter. Feedback to the inputs Vi and $Vi_n$ from the outputs Vo and $Vo_b$ sustain the oscillation. The output signal of VCO 100 is typically taken from the outputs Vo and Vob of the last inverter, inverter 120.

Figure 2:
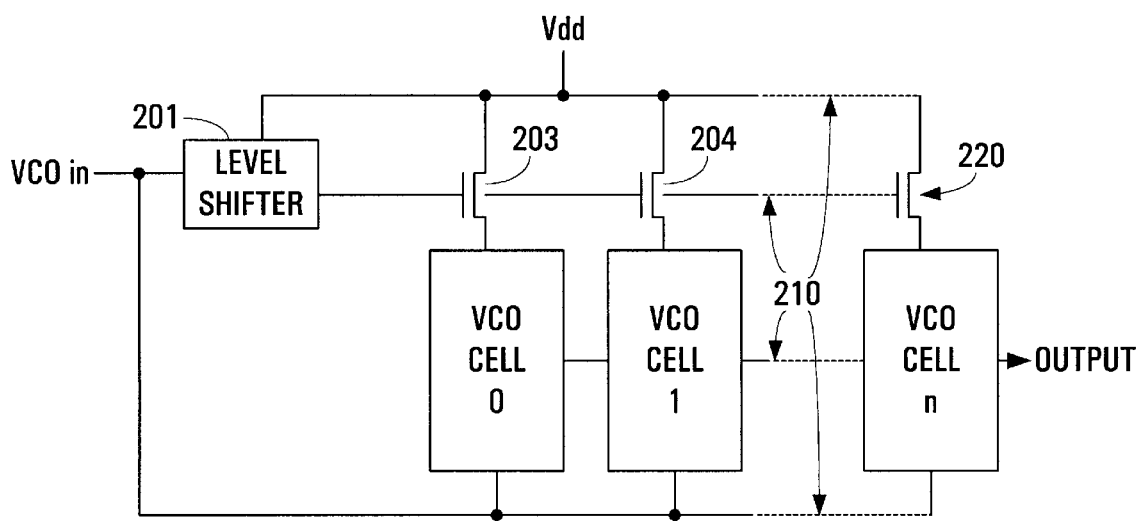
FIG. 2 shows a more detailed block diagram of a VCO in accordance with one embodiment of the present invention.

VCO 100 functions by maintaining a stable, predictable, output signal at Vo and $Vo_b$ having a frequency which corresponds to an externally applied control voltage (shown in FIG. 2). The frequencies at Vo and $Vo_b$ are substantially the same except for being opposite in phase. The present invention functions by ensuring the output signal taken from Vo and Vob remains stable and relatively unaffected by noise on a power supply for the inverters 101–120.

Referring now to FIG. 2, a more detailed block diagram of a VCO 200 in accordance with present invention is shown. VCO 200 includes a plurality of VCO cells coupled in a chain, in the same manner as inverters 101–120 of VCO 100. The first VCO cell, VCO cell 0, is coupled to VCO cell 1, and so on, through the last VCO cell in the chain, VCO cell n. The plurality of VCO cells (not shown) between VCO cell 1 and VCO cell n are similarly coupled via dotted lines 210. As with the number of inverters in VCO 100, the number of VCO cells in VCO 200 largely determines the resulting natural frequency of oscillation and the total gain of VCO 200. And, similarly to the outputs of VCO 100, the output of VCO 200 is taken from the VCO cell n. It should be appreciated, however, that the output may be taken from any VCO cell in VCO 200. Alternatively, depending upon the particular application contemplated for VCO 200, a combination of VCO cells, or all VCO cells, can be coupled to provide the output signal.

VCO 200, in accordance with the present embodiment, includes a level shifter 201. The output of level shifter 201 is coupled to each of source follower transistors 203, 204, and so on, through to source follow transistor 220 (e.g., where each of VCO cells 0 through n have a respective corresponding source follower transistor). Each of the source follower transistors 203–220 have their respective drains coupled to Vdd (e.g., 3.3 v power supply) and their respective sources coupled to their respective VCO cells.

The level shifter 201 functions by providing a voltage at the gates of source follower transistors 203–220. $VCO_{in}$ is the control voltage for VCO 200. $VCO_{in}$ controls the frequency of oscillation. Level shifter 201 functions by "shifting" the voltage of VCOin to an increased level, such that Vgs of source follower transistors 203–220 is sufficient to keep them in saturation.

The source follower transistors 202–220 function by isolating noise on Vdd from the VCO cells. The impedance of source follower transistors 203–220 is very high. The output voltage from level shifter 201 is of sufficient magnitude to keep source follower transistors 203–220 in their saturation regions. As described above, VCOin functions as the control voltage regulating the frequency of oscillation of VCO 200. As such, the frequency of oscillation is externally controlled by varying the voltage of VCOin. Hence, level shifter 201 increases the magnitude of VCOin for coupling to source follower transistors 203–220. This keeps source follower transistors 203–220 in saturation even when VCOin is low. With respect to VCO cells 0 through n, however, VCOin remains unaffected by the operation of level shifter 201.

Figure 3A:
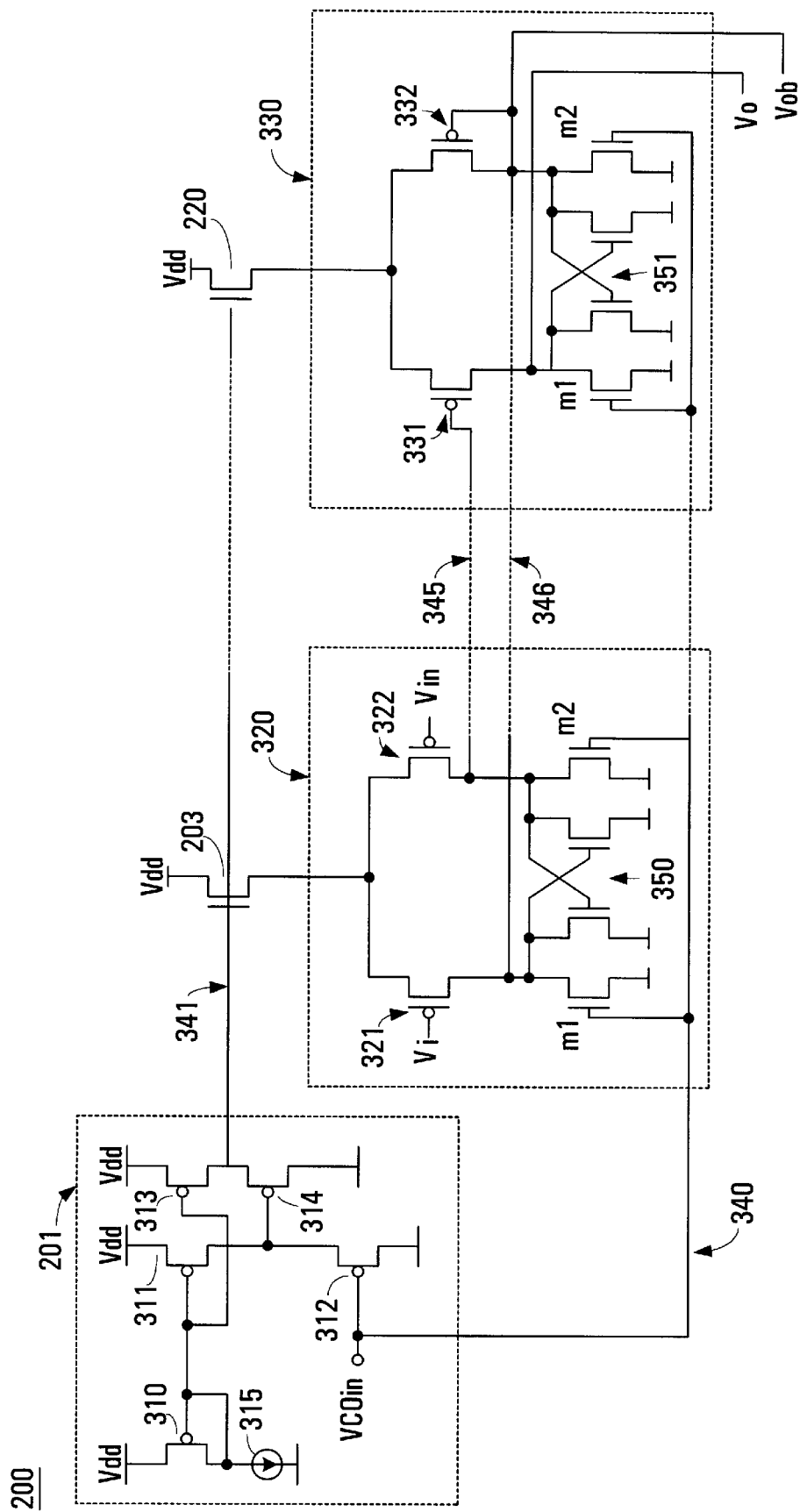
FIG. 3A shows a circuit diagram of the VCO from FIG. 2.

FIG. 3A shows a circuit diagram of VCO 200. VCO cell 320 corresponds to VCO cell 0, and VCO cell 330 corresponds to VCO cell n. VCO cell 320 includes a transistor 321 and transistor 322, both coupled to Vdd through source follower transistor 203. Voltages Vi and $Vi_n$ are respectively coupled to transistors 321–322. A load transistor m1 and a load transistor m2 are respectively coupled between transistors 321–322 and line 340. Transistors m1 and m2 are also coupled to cross-connected transistors 350. VCO cell 330 is similarly constructed, including transistors 331 and 332, respective load transistors m1 and m2, and cross-connected transistors 351. VCO cell 330 also includes an output Vo and Vob.

As described above, a plurality of VCO cells (and their corresponding source follower transistors) are coupled between VCO cell 320 and VCO cell 330, along lines 341, 345, 346, and 340. Each of the plurality of VCO cells are coupled to lines 341, 345, 346, and 340 in a manner similar to VCO cell 330, as represented by the dashed portions of lines 341, 345, 346, and 340.

Level shifter 201 includes transistors 310 through 314. Transistor 310 includes a current mirror 315. Transistors 311, 312, 313, and 314 are coupled to shift the voltage level of VCOin to a higher output voltage level and couple the output voltage to line 341.

Referring still to FIG. 3A, in the present embodiment, each VCO cell, for example, VCO cell 320, functions as a differential inverter having p-channel inputs (e.g., Vi and Vin) and n-channel loads (e.g., m1 and m2). The control voltage input VCOin is applied to the gates of the n-channel loads and the cross connected transistors 350 are used to increase gain. The voltage at the node above transistor 321 and 322 is referred to as a reference voltage Vref. Where Vref is isolated and independent of Vdd, the power supply rejection ratio of VCO 200 is ideal. In the present embodiment, Vref is isolated from Vdd by source follower transistor 203 and transistor 321. By effecting a high impedance at the drain of source follower transistor 203, changes in Vdd have little effect on Vref.

In addition to the action of level shifter 201 and source follower transistors 203–220, the power supply rejection ratio of VCO 200 is further increased by coupling VCOin directly to the gates of m1 and m2 of each VCO cell (e.g., VCO cell 320) via line 340. As described above, Vi and $Vi_n$ are coupled to Vo and $Vo_b$ of the adjacent VCO cells. The transistors m1 and m2 operate in their saturation regions most of the period in which they are on while transistors 321 and 322 operate in their linear regions. Thus, changes in Vref, which cause changes in Vds of transistors m1 and m2, have a second order effect on the current flowing through m1 and m2. For example, the frequency of VCO 200 is determined by the total current flowing through each VCO cell (e.g., VCO cell 320). The current in each VCO cell is set by the action of transistors m1 and m2. Since the voltage at the gates of m1 and m2 is set by $VCO_{in}$, irrespective of Vdd, the power supply rejection ration is further increased. In the present embodiment, Vgs for transistors m1 and m2 is independent from Vdd.

Figure 3B:
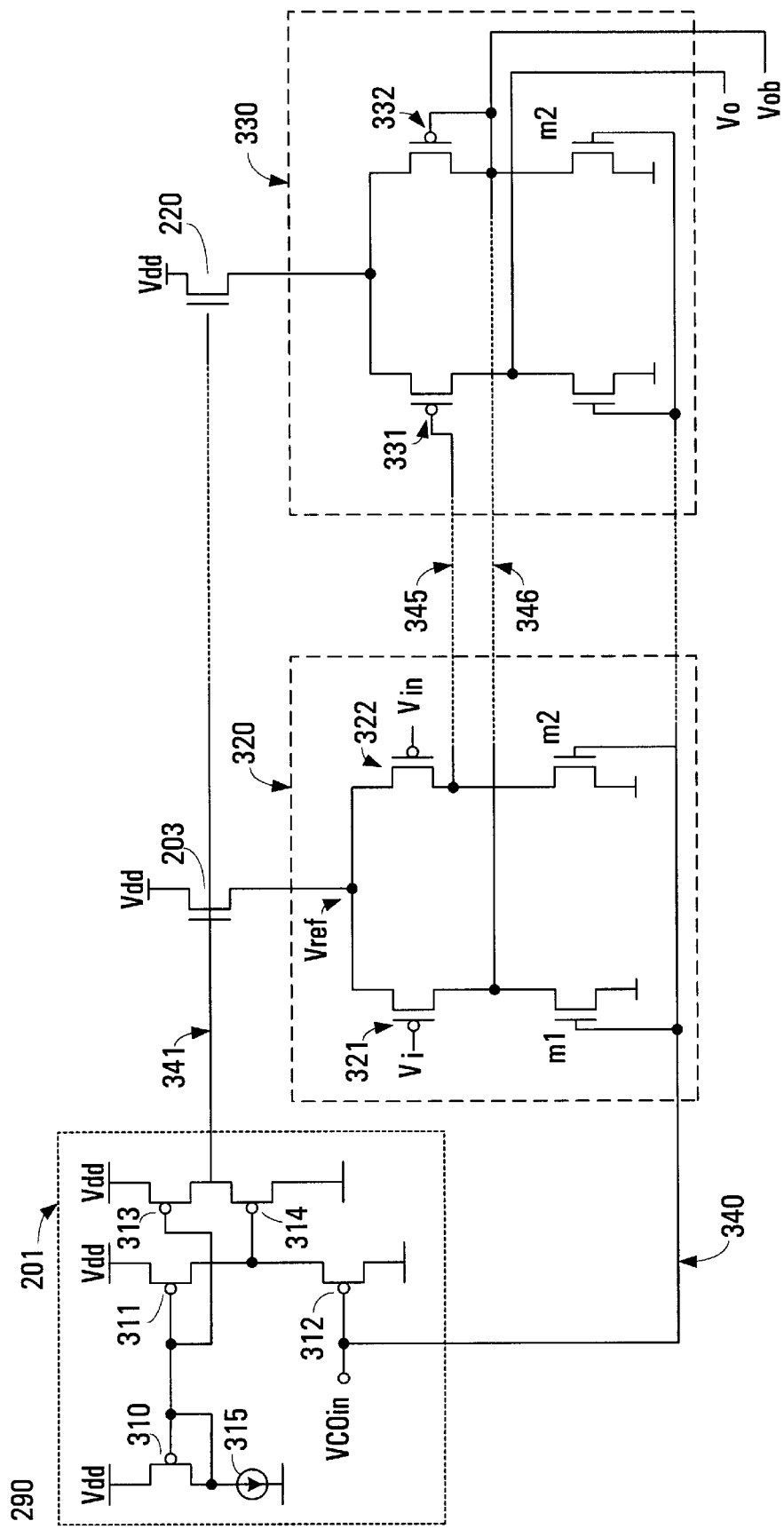
FIG. 3B shows a circuit diagram of a VCO in accordance with an alternate embodiment of the present invention.

FIG. 3B shows a VCO 290 in accordance with an alternate embodiment of the present invention. VCO 290 is similar to VCO 200 except that the cross coupled transistors in each VCO cell (e.g., cross coupled transistors 350 and 351) are eliminated. In other respects, VCO 290 functions similarly to VCO 200.

Figure 4:
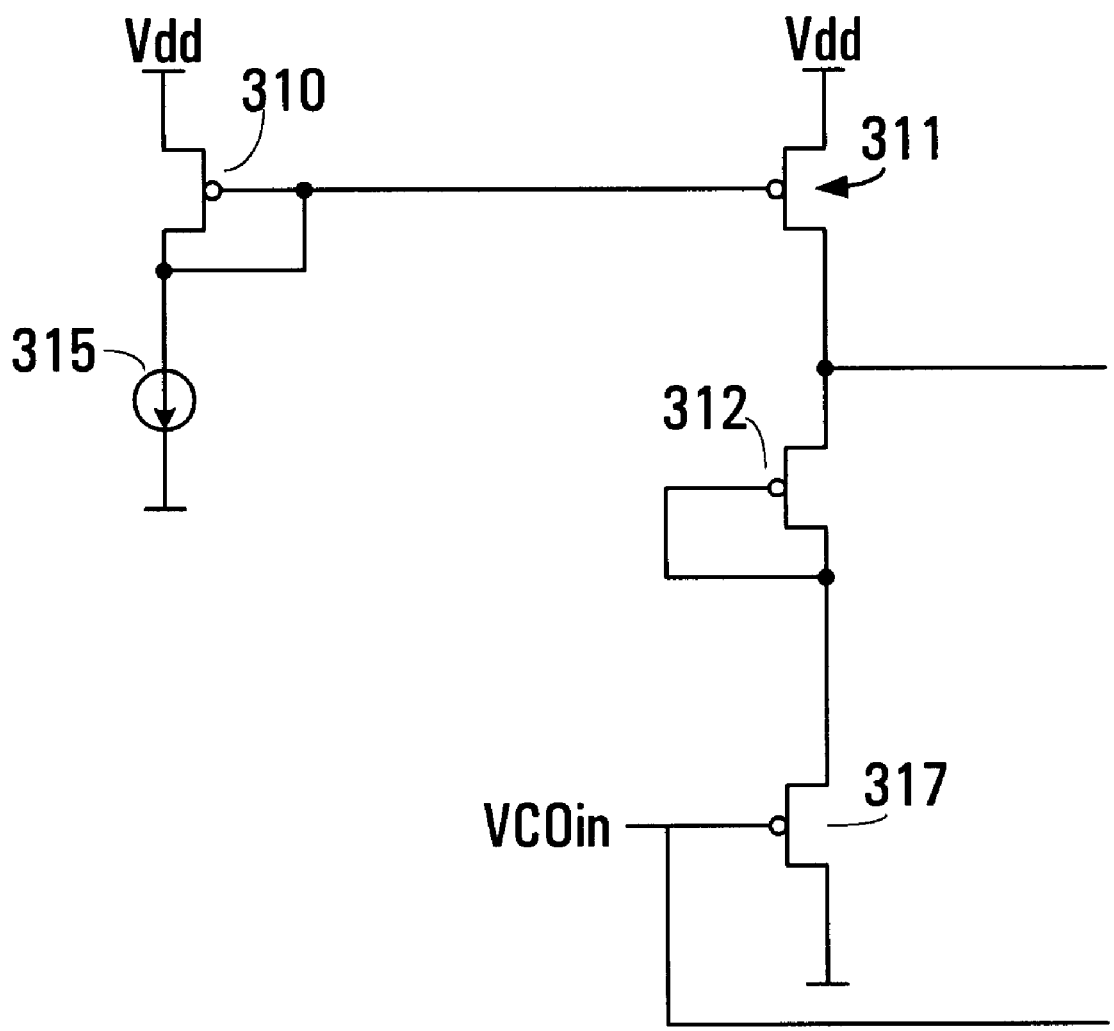
FIG. 4 shows a level shifter circuit in accordance with an alternate embodiment of the present invention.

With reference now to FIG. 4, a level shifter 400 in accordance with an alternate embodiment of the present invention is shown. Level shifter 400 is coupled to VCO 200 in a manner similar to level shifter 201, however, level shifter 400 includes transistor 317 coupled to VCOin and transistor 312, and eliminates transistors 313 and 314. Level shifter 400 has only two current paths to ground, in contrast to level shifter 201 which has three current paths to ground. Hence, Level shifter 400 consumes less power than level shifter 201. In addition, by including one less transistor than level shifter 201, level shifter 400 is less expensive (e.g., consumes less silicon area) than level shifter 201.

Figure 5:
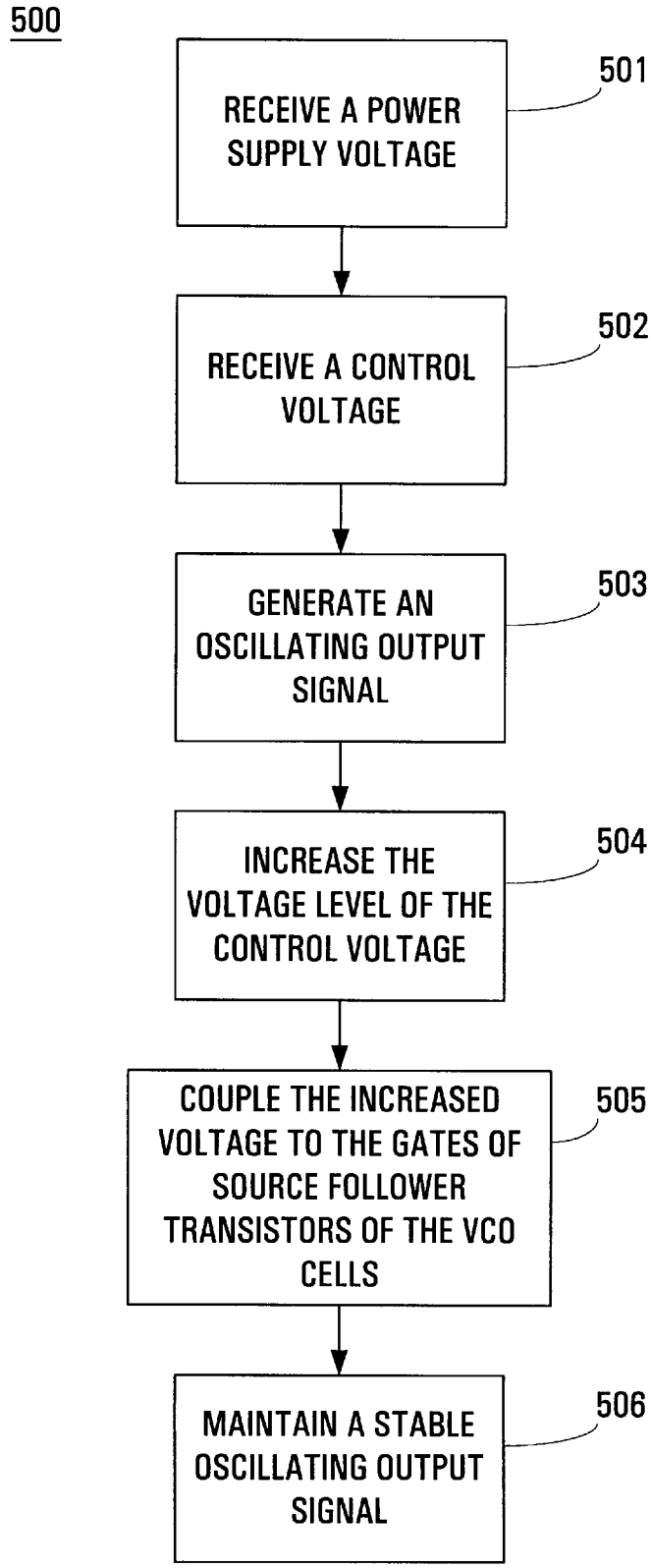
FIG. 5 shows a flow chart of the steps of a process in accordance with one embodiment of the present invention.

FIG. 5 shows a flow chart of the steps of a process 500 in accordance with one embodiment of the present invention. Process 500 begins in step 501, where a VCO (e.g., VCO 200 from FIG. 3A) receives a power supply voltage Vdd. VCO 200 is coupled to Vdd via a plurality of included source follower transistors (e.g., source follower transistors 203–220). The current from Vdd sets up an internal oscillation.

In step 502, VCO 200 receives a control voltage input (e.g., $VCO_{in}$) from an external circuit. The control voltage input sets the frequency of oscillation within VCO 200. The frequency of oscillation is variable in response to changes in the control voltage.

In step 503, the oscillation described above is used to generate an oscillating output signal. As described above, in the present embodiment, the output signal is taken from one of the VCO cells in VCO 200 (e.g., VCO cell 330). A first output, Vo, and a second output, $Vo_b$, are coupled to VCO cell 330 such that $Vo_b$ is an inverted version of Vo (e.g., phase reversed).

In step 504, VCO 200, in accordance with the present invention, a level shifter (e.g., level shifter 201) increases the voltage of VCOin to generate an output voltage. As described above, level shifter 201 is designed to increase the voltage level of VCOin such that a corresponding output voltage is sufficient to keep source follower transistors in saturation.

In step 505, the output voltage provided by level shifter 201 is coupled to the gates of each of source follower transistors 203–220, keeping them in saturation and thereby maintaining their high impedance.

In step 506, VCO 200, in accordance with the present invention, maintains a stable oscillating output signal, less sensitive to noise on Vdd. The output signal retains its stability due to the fact that VCO 200, as described above, rejects noise on Vdd.

Figure 6:
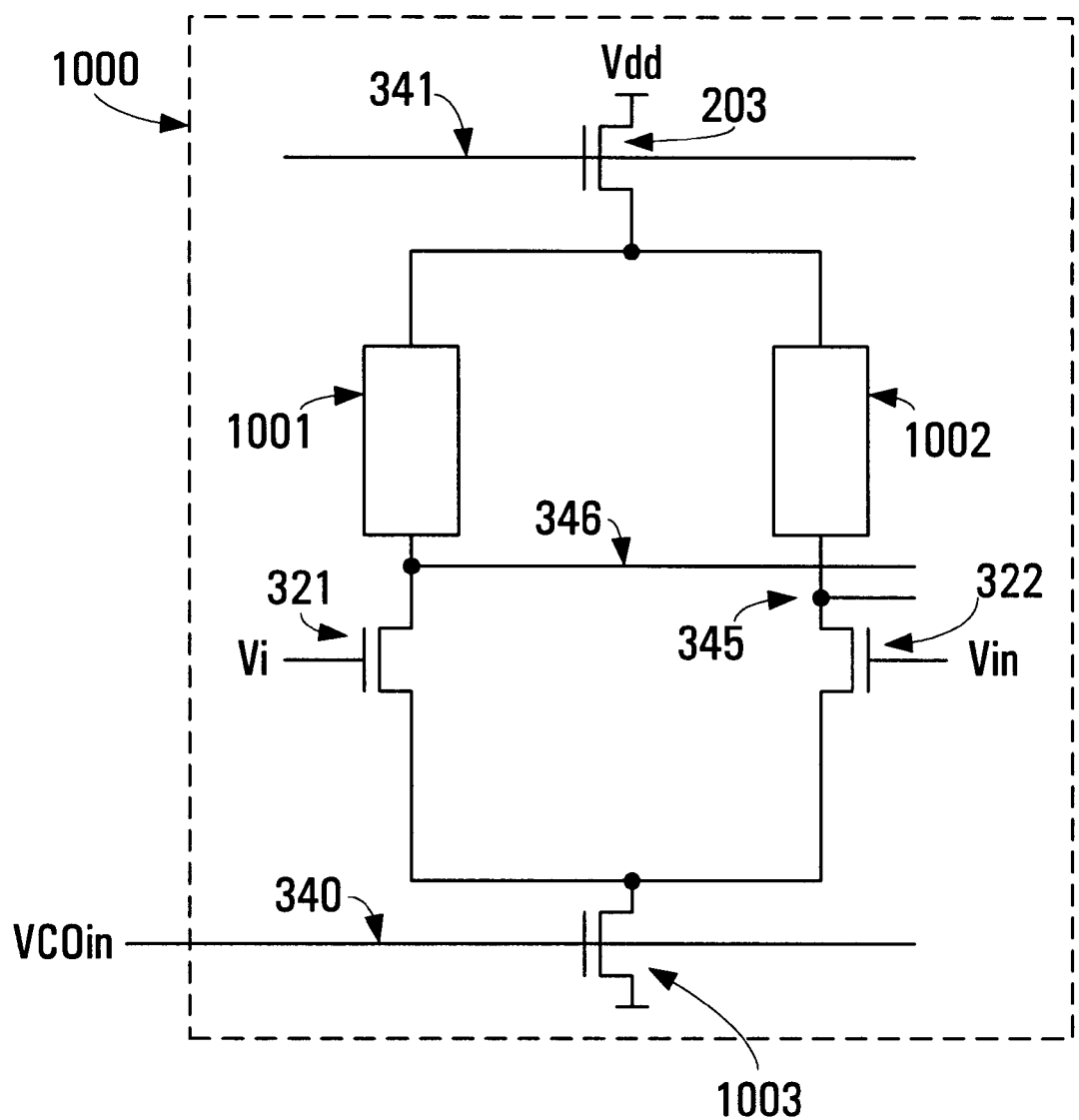
FIG. 6 shows a circuit diagram of a VCO cell in accordance with an alternative embodiment of the present invention.

Referring now to FIG. 6, a VCO cell 1000 in accordance with an alternative embodiment of the present invention is shown. VCO cell 1000 is similar to the VCO cells of VCO 200 (e.g., VCO cell 320) and functions in a similar manner. However, VCO cell 1000 includes a first load element 1001 and a second load element 1002 coupled above transistors 321 and 322. VCO cell 1000 also includes a transistor 1003. The gate of transistor 1003 is coupled to line 340 to receive VCOin. In so doing, transistor 1003 functions as a current source for VCO cell 1000. The load elements 1001 and 1002 comprise loads (e.g., diode coupled n channel transistors, resistors, or the like) between transistor 203 and transistors 321 and 322. VCO cell 1000 is utilized in cases where higher operating frequency is desired.

Thus, the present invention provides a solution which solves the power supply noise problems associated with the prior art. The present invention is not adversely affected by noise in the power supply. In addition, the present invention exhibits higher power supply noise rejection than prior art VCOs.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A voltage controlled oscillator (VCO) circuit having a very high power supply noise rejection ratio, comprising:

a VCO input for receiving a control voltage;

a level shifter circuit coupled to said VCO input;

a first VCO cell coupled to said level shifter circuit;

a second VCO cell coupled to said first VCO cell and said level shifter circuit;

a VCO output for transmitting a VCO output signal;

a first source follower transistor coupled to said first VCO cell to transmit a first voltage from said power supply to said first VCO cell;

a second source follower transistor coupled to said second VCO cell to transmit a second voltage from said power supply to said second VCO cell, the gate of said first source follower transistor and the gate of said second source follower transistor coupled to receive an output of said level shifter operable to increase power supply noise rejection ratio of said VCO circuit;

a first and second load transistor included in each of said first and second VCO cells, said first and second load transistors coupled to said VCO input to receive said VCO input independent of said power supply such that said VCO output signal is insensitive to noise on said power supply; and a first and second cross coupled transistor included in each of said first VCO cell and said second VCO cell, said first and said second cross coupled transistors respectively coupled to said first and second load transistors included in each of said first VCO cell and said second VCO cell to limit the amplitude of current flowing respectively through said first and second load transistors.

2. The VCO circuit of claim 1, further comprising:

a first and second voltage input included in each of said first VCO cell and said second VCO cell;

a first and second voltage output included in each of said first VCO cell and said second VCO cell;

said first and second voltage output of said first VCO cell respectively coupled to said first and second voltage input of said second VCO cell and said first and second voltage output of said second VCO cell respectively coupled to said first and second voltage input of said first VCO cell to sustain an oscillation within said VCO circuit.

3. The VCO circuit of claim 1, wherein said VCO input is coupled to said level shifter and said VCO input is coupled to said first and said second VCO cell to control the frequency of said VCO output signal.

4. The VCO circuit of claim 1, wherein said level shifter includes an output and said output is coupled to the gate of said first source follower transistor and said second source follower transistor to maintain said first and said second source follower transistors in saturation.

5. A voltage controlled oscillator (VCO) circuit having a very high power supply noise rejection ratio, comprising:

a VCO input for receiving a control voltage;

a level shifter circuit coupled to said VCO input;

a first VCO cell coupled to said level shifter circuit;

a second VCO cell coupled to said first VCO cell and said level shifter circuit;

a VCO output for transmitting a VCO output signal;

a first source follower transistor coupled to said first VCO cell to transmit a first voltage from said power supply to said first VCO cell;

a second source follower transistor coupled to said second VCO cell to transmit a second voltage from said power supply to said second VCO cell; and a first and second load transistor included in each of said first and said second VCO cells, said first and second load transistors coupled to receive said VCO input and said level shifter circuit respectively coupled to the gates of said first and said second source follower transistors to maintain said first and said second source follower transistors in saturation such that said VCO output signal is insensitive to noise on said power supply, and such that said VCO input is received by said first and second load transistors independent of said power supply voltage to reduce an affect of noise in said power supply voltage on said VCO output signal; and a first and second cross coupled transistor included in each of said first VCO cell and said second VCO cell, said first and said second cross coupled transistors respectively coupled to said first and second load transistors included in each of said first VCO cell and said second VCO cell to limit the amplitude of current flowing respectively through said first and second load transistors.

6. The VCO circuit of claim 5, further comprising:

a first and second voltage input included in each of said first VCO cell and said second VCO cell;

a first and second voltage output included in each of said first VCO cell and said second VCO cell;

said first and second voltage output of said first VCO cell respectively coupled to said first and second voltage input of said second VCO cell and said first and second voltage output of said second VCO cell respectively coupled to said first and second voltage input of said first VCO cell to sustain an oscillation within said VCO circuit.

7. In a voltage controlled oscillator (VCO) circuit including a level shifter circuit coupled to a plurality of VCO cells, a method of maintaining a stable VCO output signal and rejecting noise on a coupled power supply, the method comprising the steps of:

a) receiving a power supply voltage in a VCO circuit from a coupled power supply;

b) receiving a control voltage input in said VCO circuit;

c) generating an oscillating VCO output signal responsive to said control voltage input;

d) generating a level shifted output voltage in a level shifter circuit from said control voltage;

e) coupling said output voltage to a plurality of source follower transistors included in said VCO circuit, said VCO circuit coupled to said power supply via said plurality of source follower transistors, the level shifted output coupled to the gates of said source follower transistors and operable to increase power supply noise rejection ratio of said VCO circuit, a first and second cross coupled transistor included in each of said first VCO cell and said second VCO cell, said first and said second cross coupled transistors respectively coupled to a plurality of load transistors included in each of said first VCO cell and said second VCO cell to limit the amplitude of current flowing respectively through said plurality of load transistors;

f) receiving said control voltage input directly at said plurality of load transistors included in said VCO circuit, said load transistors coupled to said control voltage input; and g) maintaining a stable oscillating output signal from said VCO circuit through the action of said source follower transistors and said plurality of load transistors.

8. The method of claim 7, further comprising the step of increasing the voltage of said control voltage input using said level shifter circuit to generate said output voltage and coupling said output voltage to the gates of said plurality of source follower transistors.

9. The method of claim 7, wherein step f) further includes receiving said control voltage directly at said plurality of load transistors independent of said power supply voltage to reduce an affect of noise in said power supply voltage on said oscillating output signal.

10. A voltage controlled oscillator (VCO) circuit having a high power supply noise rejection ratio, comprising:

a VCO input for receiving a control voltage;

a level shifter circuit coupled to said VCO input, said level shifter circuit including a current mirror circuit for improved stability with respect to noise on a coupled power supply;

a first VCO cell coupled to said level shifter circuit;

a second VCO cell coupled to said first VCO cell and said level shifter circuit;

a VCO output for transmitting a VCO output signal;

a first source follower transistor coupled to said first VCO cell to transmit a first voltage from said power supply to said first VCO cell;

a second source follower transistor coupled to said second VCO cell to transmit a second voltage from said power supply to said second VCO cell, the gate of said first source follower transistor and the gate of said second source follower transistor coupled to receive an output of said level shifter operable to increase power supply noise rejection ratio of said VCO circuit;

a first and second load transistor included in each of said first and second VCO cells, said first and second load transistors coupled to said VCO input to receive said VCO input independent of said power supply such that said VCO output signal is insensitive to noise on said power supply; and a first and second cross coupled transistor included in each of said first VCO cell and said second VCO cell, said first and said second cross coupled transistors respectively coupled to said first and second load transistors included in each of said first VCO cell and said second VCO cell, said first and said second cross coupled transistors operable for limiting the amplitude of current flowing respectively through said first and second load transistors has said first VCO cell and said second VCO cell oscillate.

11. The VCO circuit of claim 10, further comprising:

a first and second voltage input included in each of said first VCO cell and said second VCO cell;

a first and second voltage output included in each of said first VCO cell and said second VCO cell;

said first and second voltage output of said first VCO cell respectively coupled to said first and second voltage input of said second VCO cell and said first and second voltage output of said second VCO cell respectively coupled to said first and second voltage input of said first VCO cell to sustain an oscillation within said VCO circuit.

12. The VCO circuit of claim 10, wherein said VCO input is coupled to said level shifter and said VCO input is coupled to said first and said second VCO cell to control the frequency of said VCO output signal.

13. The VCO circuit of claim 10, wherein said level shifter includes an output and said output is coupled to the gate of said first source follower transistor and said second source follower transistor to maintain said first and said second source follower transistors in saturation.

* * * * *